United States Patent [19]

Krüger

[11] Patent Number: 4,701,702
[45] Date of Patent: Oct. 20, 1987

[54] CONTACT PIN HAVING A SPRING UNDER TENSION

[75] Inventor: Gustav Krüger, Herrenberg, Fed. Rep. of Germany

[73] Assignee: Feinmetall GmbH, Herrenberg, Fed. Rep. of Germany

[21] Appl. No.: 4,102

[22] Filed: Jan. 16, 1987

Related U.S. Application Data

[62] Division of Ser. No. 709,169, Mar. 7, 1985.

[30] Foreign Application Priority Data

Mar. 8, 1984 [DE] Fed. Rep. of Germany ....... 3408375

[51] Int. Cl.$^4$ .............................................. G01R 1/06
[52] U.S. Cl. .............................. 324/158 P; 324/72.5; 324/158 F
[58] Field of Search ........... 324/158 P, 73 PC, 158 F, 324/72.5; 339/108 TP; 267/73, 74; 272/114

[56] References Cited

U.S. PATENT DOCUMENTS 4,321,532 3/1982 Luna ............................. 324/73 PC

FOREIGN PATENT DOCUMENTS 3332187 9/1985 Fed. Rep. of Germany ... 324/158 P

Primary Examiner—Ernest F. Karlsen
Assistant Examiner—Vinh P. Nguyen
Attorney, Agent, or Firm—Karl F. Ross; Herbert Dubno

[57] ABSTRACT

A spring-loaded contact pin for testing a plurality of closely spaced contacts of a test sample includes a casing in which a plunger is movably guided and under the influence of a spring in tension. In order to allow a simultaneous testing of these contacts, the casing as well as the plunger of the contact pins have an oblong cross section which means that the dimension in one direction is longer than the dimension in a direction normal to the one direction.

9 Claims, 5 Drawing Figures

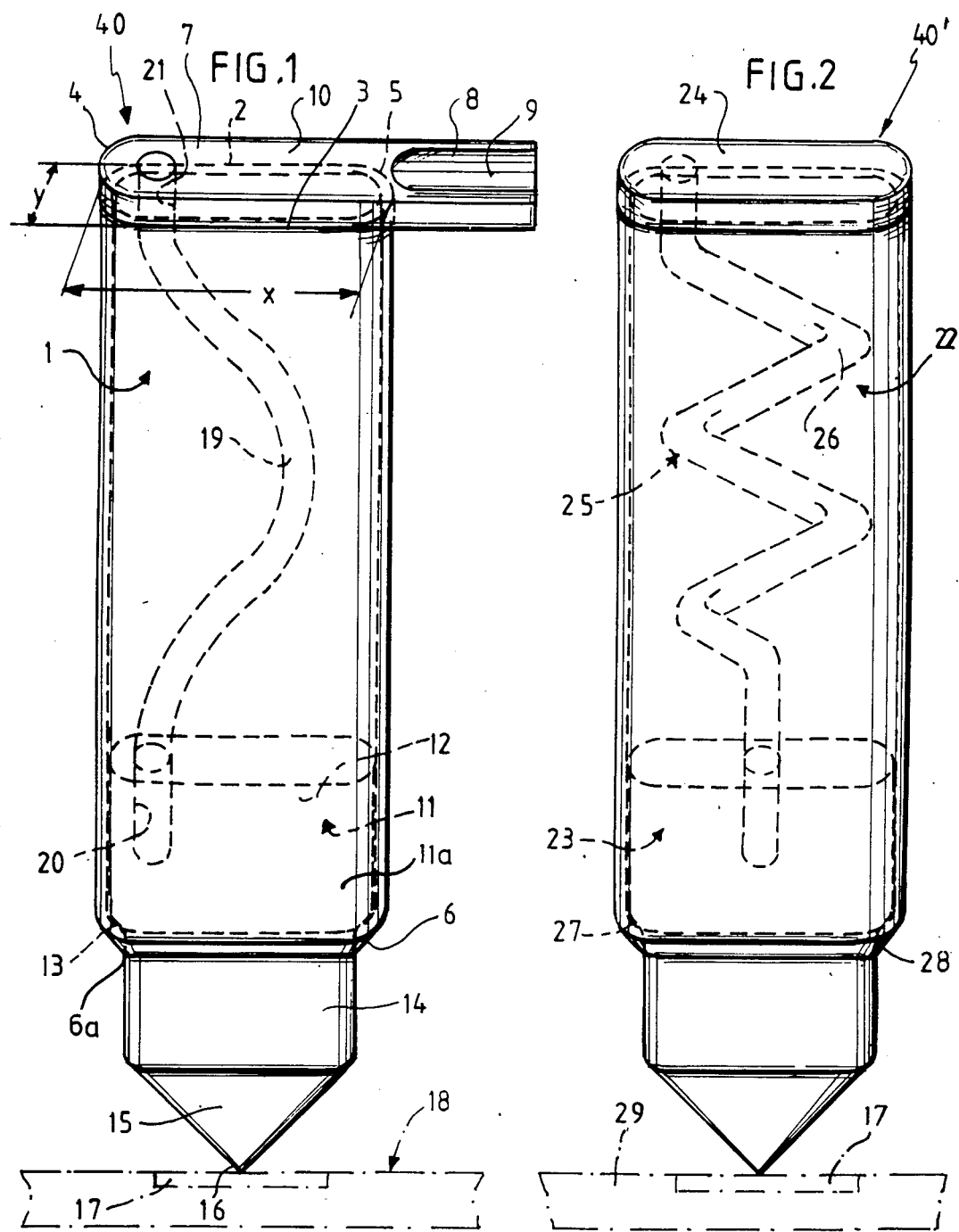

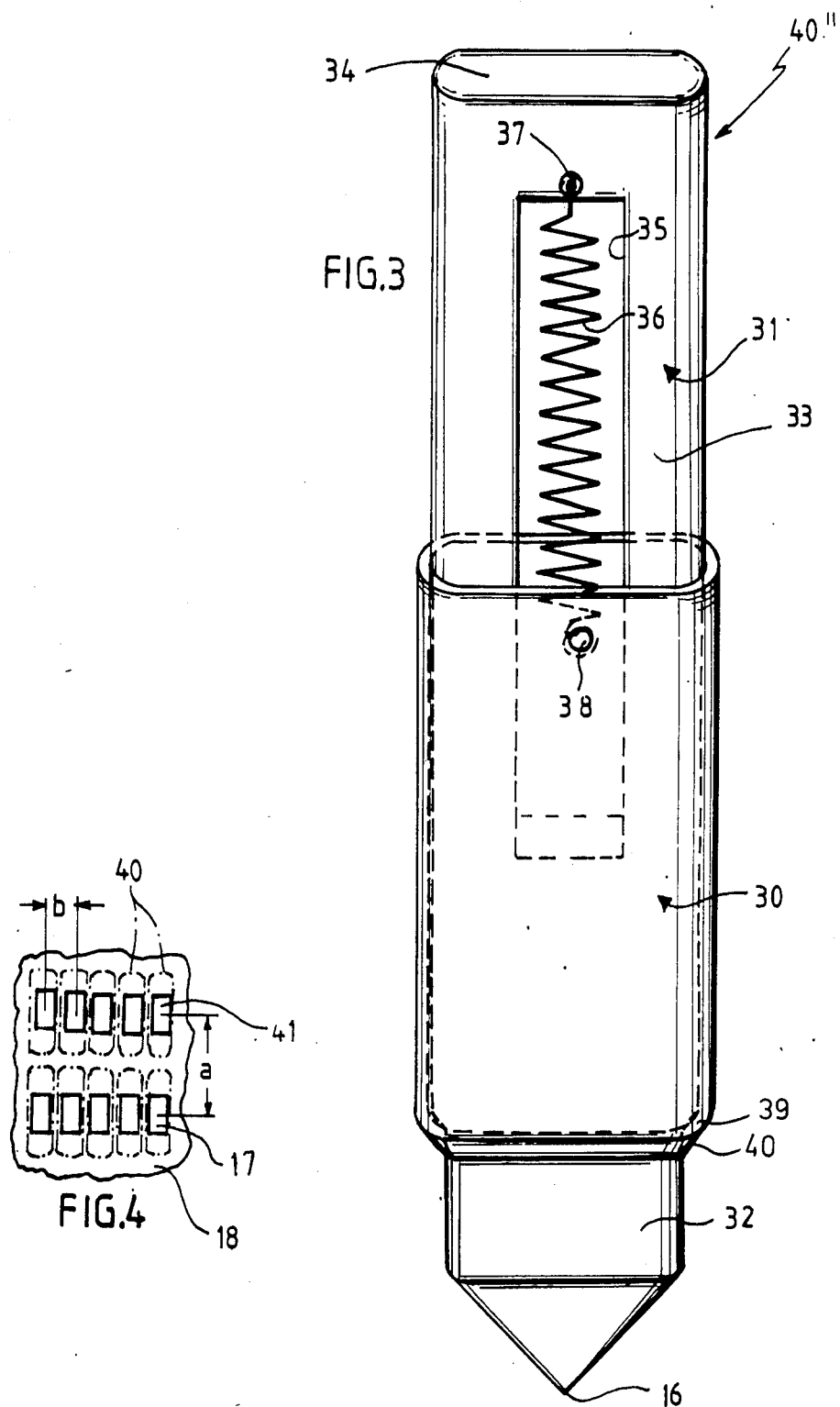

CONTACT PIN HAVING A SPRING UNDER TENSION

This is a divisional of co-pending application Ser. No. 709,169, filed on Mar. 7, 1985.

FIELD OF THE INVENTION

My present invention relates to a spring-loaded contact pin for contacting test objects, like printed-circuit boards, integrated circuit units and the like to test their electric operativeness.

BACKGROUND OF THE INVENTION

In the production of electrical circuit assemblies it is desirable to effect tests of the conductive pathways and circuit components. A common approach is to apply a multicontact test probe or adapter to the printed circuit board and then evaluate the pathways or components using logic circuitry or other conventional test circuitry.

In general test adapters are used which include a number of individual spring-loaded contact pins. Each contact pin has a casing in which a piston or plunger is accommodated in a movable manner.

The plunger is under the influence of a spring which exerts sufficient force on the plunger so that the latter properly contacts the test sample.

These test adapters are thus usable for simultaneously testing a number of contacts of a corresponding test sample so as to determine whether any, all or no conductors or other electrical or electronic components are intact and meet the intended functions.

Such test samples consist frequently of at least one straight row of contacts which are closely arranged next to one another. Since these contacts must simultaneously be tested, it is required to have the contact pins as closely arranged to one another as possible.

In known spring-loaded contact pins, the casings as well as the plungers have circular cross sections. For loading the plungers within the casing, prestressed compression springs are used which must exert relatively high forces—usually 50–300 cN (grams)—to provide a secure electrical connection of the test contacts with the tips or heads of the plungers.

This requirement limits, however, the possibility of reducing the diameter of the casing of such contact pins.

It has thus been proposed to connect the plunger of each contact pin with a thin wire-like extension which is guided within a hollow needle and in this manner is closely approached to the test sample (see Yearbook of the German Society of Chronometry, vol. 30, 1979, pages 269–276).

Although this technique allows the free ends of the extensions to be squeezed together more closely than is feasible with the contact pins directly, this construction is very complicated to produce, sensitive and rather expensive.

In addition this arrangement has some drawbacks as to function. The long extensions cannot be guided in a frictionless manner within the hollow needles so that malfunctions have been experienced. In particular, the force exerted by the spring on the plunger cannot completely be transmitted onto the extensions. This means that the tip of the plunger may not be provided with sufficient load to achieve an electric connection with the contacts, thus leading to inaccurate results.

OBJECTS OF THE INVENTION

It is thus the principal object of my present invention to provide an improved spring-loaded contact pin obviating the afore-stated drawbacks.

Another object is to provide a contact pin for the aforedescribed purpose which can be used with a smaller interpin spacing but with greater contact force than has been possible heretofore.

SUMMARY OF THE INVENTION

I realize these objects by providing the contact pins with a casing in which a plunger is movably guided whereby the casing and the plunger have an oblong cross section which means that their dimension in one direction (i.e. an x-direction), that is in longitudinal direction of the cross section, is essentially greater than in a direction (i.e. a y-direction) normal thereto, that is in transverse direction. By means of a spring, the plunger can be retained in a neutral position and be forced into close contact with a test sample during its testing.

According to another feature of my invention, the cross section of the casing is at least 1.2 times, preferably about twice as long in the longitudinal direction as in transverse direction.

In particular, the casing can have a width (i.e. in transverse direction) of 0.4 to 3 mm so that the central distance between two adjacent contact pins is very small and actually is only slightly wider than the thickness of the casing. Thus, contact springs can be provided with central distances from each other impossible to be obtained with the known circular cylindrical casings. In the longitudinal direction (corresponding to the depth of the contact pin), the casing can be provided rather wide, e.g. between 1 and 10 mm, preferably 3 mm. Thus, the plunger can be securely guided in the casing with less friction and a sufficient current conduction is obtained even under unfavorable conditions.

Because of the oblong cross section, the contact pins can thus be provided in a very slim manner so that the use of extensions, as were previously necessary when especially closely spaced contacts were to be tested, can be avoided. Thus, the spring-loaded contact pins allow a further miniaturization of test probes and the samples monitored thereby.

Despite the slim design of the contact pins, the spring as well as the casing and plungers have sufficient stability to obtain accurate results. Even when designing the casing extremely slim, relatively strong springs can still be used. The spring forces can suitably be approximately 50 to 300 cN.

The spring-loaded contact pins according to the invention are simple and robust in construction, inexpensive to manufacture but still reliable in operation. Moreover, the plungers can be provided so that there is hardly any friction when being moved in axial direction within the casing.

It is obvious that the use of such contact pins is especially advantageous when testing contacts which are closely spaced in straight rows but whose central distance between contacts of two adjacent rows is larger than the central distance between adjacent contacts in one row. Such straight rows of contacts or testing locations which are usually provided according to a linear raster serve as contacts of printed circuits, integrated circuits and the like.

The spring acting upon the plunger can advantageously be provided such that it is more extended in longitudinal direction of the cross section than in transverse direction.

While it is preferred to use a flat spiral spring, the spring can also have the shape of a strip or wire which is straight-lined or only slightly curved when being in a relaxed state and is deflected when being assembled within the contact pin. In case a larger spring excursion is required, spiral coils are used having a plurality of winding turns.

For even larger spring excursions and when a flat spring characteristic is desired, the use of a draw (tension) spring, especially a helical spring, is preferred. According to a feature of my invention, the plunger is provided with a cutout in which the draw spring is accommodated such that one of its ends is connected to the plunger and its other end is attached to the casing.

According to another feature of my invention, the plunger is retained in a neutral position by stop means against which the plunger is pushed under the action of the spring. To create such stop means, the lower end of the otherwise cylindrical casing is tapered so as to define an abutment on which the plunger rests when in the neutral position.

The top portion of the casing is closed by a lid which is usable as a terminal to allow connecting lines of associated analyzers or like devices, to be easily attached thereto. It is, however, also possible to extend the plunger beyond the top portion of the casing. In this case, no lid is provided and the rearward end of the plunger may advantageously be used as a terminal for the connecting lines.

BRIEF DESCRIPTION OF THE DRAWING

The above and other objects, features and advantages of the present invention will become more readily apparent from the following description with reference to the accompanying drawing in which:

FIG. 1 is an oblique view of a first embodiment of a spring-loaded contact pin according to the invention;

FIG. 2 is an oblique view of a second embodiment of a spring-loaded contact pin;

FIG. 3 is a perspective view of a third embodiment of a spring-loaded contact pin according to the invention;

FIG. 4 is a top view of a section of a test sample; and

SPECIFIC DESCRIPTION

Figure 5:
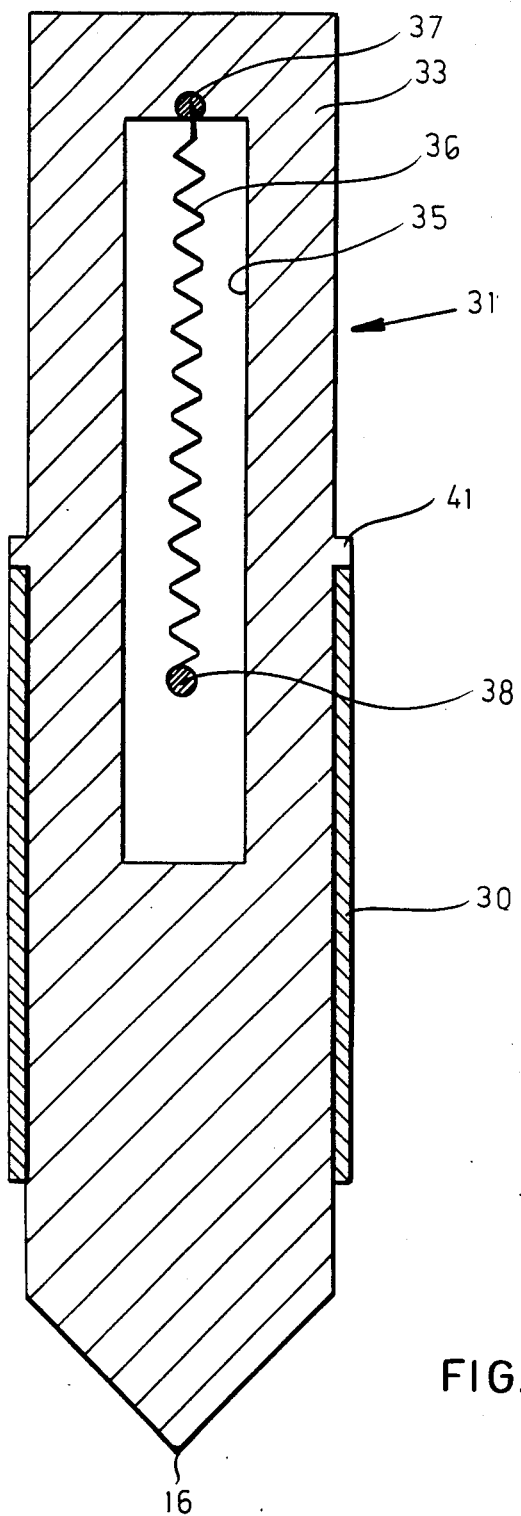
FIG. 5 is a side-elevational view of a modification of the spring-loaded contact pin of FIG. 3.

FIG. 1 shows an elongated and essentially hollow cylindrical spring-loaded contact pin generally designated by reference numeral 40. The contact pin 40 is made of metal and has a casing 1 with an oblong cross section whose contour is indicated in the upper rearward end of the pin 40.

Accordingly, the casing 1 includes two side walls 2, 3 which extend parallel to each other and are connected at their ends by roundings 4,5.

As is shown in FIG. 1, the side walls 2,3 are spaced from each other by a distance y (corresponding to the width of the casing 1) which is essentially smaller than the distance x defined between the apexes of the roundings 4,5 i.e the width of the casing 1 is essentially smaller than the depth thereof. I have found to be advantageous when the distance x is at least 1.2 times, preferably twice as long as the distance y. In particular, the distance x between the apexes of the roundings 4,5, that is in longitudinal direction of the cross section, is between approximately 1 to 10 mm, preferably 3 mm, while the width or distance y in transverse direction of the cross section can amount to approximately 0.4 to 3 mm.

In this connection, I may note that the maximum cross section of the casing 1 has a contour which fits into an imaginary rectangle, i.e. is generally rectangular with long sides extending parallel to the longitudinal direction of the cross section, i.e. parallel to the depth x, and with short sides extending parallel to the transverse direction of the cross section, i.e. parallel to the width y whereby the contour has at least one respective point in common with each of the four sides of the geometric rectangle.

At its lower end, the casing 1 is tapered so as to provide an abutment 6 which defines an opening 6a. Accommodated in the lower section of the casing 1 is a metallic and elongated plunger 11 which is movably guided in longitudinal direction relative to the casing 1. The plunger 11 has a cylindrical portion 11a whose upper or rearward end constitutes a guide member 12. The guide member 12 has a cross section which essentially corresponds with a certain sliding play to the inner cross section of the cylindrical section of the casing 1.

Therefore, it is not necessary to fit the cylindrical portion 11a of the plunger 11 within the casing 1 such that its outer circumference lies completely against the casing 1 to provide a contact therebetween; rather it is sufficient when only certain areas thereof lie against the casing 1—e.g. the guiding member 12—so that contact is secured and guidance of the plunger 11 in the casing 1 is guaranteed.

The lower end of the cylindrical portion 11a of the plunger 11 is also tapered and defines a shoulder 13 which lies against the abutment 6 when the plunger 11 is in the neutral or lowermost position. Extending from the shoulder 13 is a probe member 14 which projects through the opening 6a towards a test sample 18. The probe member 14 can have a cross section which corresponds essentially to or may be smaller than the cross section of the opening 6a and is provided with a contact part 15 whose tip 16 is to be brought into contact with a respective one of the test contacts 17 for testing the latter for their electrical operativeness. Depending on the requirements of the test, the contact part 15 can be of conical or hollow conical shape provided with smooth, edged or grooved surfaces. Through the provision of the conical tip 16, oxide films, contaminations or other deposits impairing the conductivity and accumulating on the contacts 17 of the test sample can be penetrated during the testing.

The upper or rearward end of the hollow casing 1 is covered and closed by a metallic lid 7 which is provided with an extension 8 projecting in a horizontal direction beyond the casing 1. The extension 8 is provided along a major portion thereof with a recess 9 which receives a wire (not shown) connecting the spring-loaded contact pin 40 with an associated analyzer (not shown). The connection of the wire within the recess 9 can be provided in any suitable manner, like e.g. through soldering, crimping or plugging as well as welding. During testing, the analyzer evaluates the electric signals flowing through the contact pin 40 from the respective contact 17 of the test sample 18. Consequently, the lid 7 operates as terminal 10 and can be connected to the casing 1 by suitable means, like pressing in, swaging, crimping, soldering or welding.

As can be seen from FIG. 1, the plunger 11 and the lid 7 are connected to each other via a spring 19 whose one end projects into a borehole 20 within the cylindrical portion 11a of the plunger 11 and whose other end extends into a borehole 21 provided within the lid 7. The spring 19 is fixed with its ends in the boreholes 20,21 by welding, especially by means of laser beams or electron-beams. It is, however, also feasible to solder or clamp the ends of the spring 19 to the lid 7 and plunger 11.

The spring 19 is a metallic compression spring which is slightly curved or extends straight-lined when being in a relaxed state i.e. before assembling the spring-loaded contact pin 40. During assembly thereof, the spring 19 is compressed to some degree when the lid 7 is connected to the casing 1 so that the plunger 11 is pushed with its shoulder 13 against the abutment 6 of the casing 1 by the prestressed spring 19. Instead of using one spring 19, it is certainly possible to use several such springs which extend essentially parallel to each other.

Although in the embodiment of FIG. 1, the major portion of the casing 1 is described as continuously cylindrical—except for the tapered lower section—I may note that the portion of the casing 1 which does not serve as guidance for the plunger 11 e. g. the upper section of the casing 1 may be of reduced cross section depending on the dimension of the spring 19.

As already mentioned, the distance x between the apexes of the roundings 4,5 is preferably approximately 1 to 10 mm while the width y is approximately 0.4 to 3 mm. Especially when high spring forces are exerted onto the plunger 11, it is advisable to provide the casing 1 with the longer dimensions.

Turning now to FIG. 4, there is shown a section of a test sample 18 which may be e.g. an integrated circuit whose connections are developed as contacts 17. The contacts 17 are arranged next to each other in a seriation whereby two rows of contacts 17 define a central distance a which is larger than the distance x when applying a test adapter provided with respective spring-loaded contact pins 40. In addition, two adjacent ones of the contacts of one row define a central distance b which is only slightly larger than the width y. Consequently, the contact pins 40 according to my invention can be designed in a compact structure unknown in comparison to prior art devices with circular casings.

When examining one test sample 18, the test adapter including a number of spring-loaded contact pins 40 arranged adjacent to each other along their side walls 2, and with their roundings 4,5 facing the contacts 17 is moved against the contacts 17 so that the plungers 11 are shifted upwardly relative to the casing 1, i.e. into the casing 1, until the shoulder 13 is disengaged from the abutment 6. Through the force exerted by the spring 19 onto the plunger 11, the tip 16 is pressed against the contacts 17 in a sufficient manner to provide an electric conductivity. The electric signals are then transmitted to and evaluated by the associated analyzer so that all required tests can be performed quickly and automatically.

Although in the embodiment of FIG. 1, the casing 1 has been described as having two individual parallel side walls 2,3 connected to each other by roundings 4,5, and a plunger 11 which is developed in a similar way, it is certainly conceivable to provide the casing 1 and the plunger 11 in any other elongated or oblong shape, preferably in an oval shape. In these cases, the spring 19 need not be entirely flat since a larger expansion in a direction transverse to the longitudinal extension of the contact pin 40 is possible, so that the stability of the spring is improved. It may also be of advantage to provide the plunger 11 of reduced diameter along all portions which do not provide a guidance of the plunger 11 within the casing 1 because through such a design, the plunger 11 can be fitted easier and more accurately with its guiding areas within the casing 1.

Certainly, it is also within the scope of my invention to modify the lower end of the casing 1 in order to provide a stop for the plunger 11 when being in the neutral stage. Instead of the described cooperation between the shoulder 13 of the plunger 11 and the abutment 6 of the casing 1, a transverse pin may e.g. be provided which projects into the interior of the casing 1 so as to retain the plunger 11 in the neutral position.

Turning now to FIG. 2 which illustrates a spring-loaded contact pin generally designated by reference numeral 40'. The contact pin 40' has a metallic casing 22 in which a plunger 23 is movably guided. Since the casing 22 and the plunger 23 are of similar design as the comparable parts in FIG. 1, no detailed description is necessary at this point. The upper end of the casing 22 is closed by a lid 24 which in contrast to the embodiment of FIG. 1 is not provided with a projection but serves directly as terminal. Clamped between the lid 24 and the plunger 23 is a metallic spring 25, e.g. a spiral spring, which is provided with several flat turns 26 so that a larger spring excursion is obtained. The connection of the ends of the spring 25 to the lid 24 and the plunger 23 is obtained in the same manner as described in connection with FIG. 1. Consequently, the spring 25 presses the plunger 23 into its neutral or lowermost position in which its shoulder 27 rests against the abutment 28 provided by the tapered end section of the casing 22.

The spring-loaded contact pin 40' works essentially in the same manner as the one described in FIG. 1. When the contact pin 40' is moved against a test sample 29, the plunger 23 will be pushed counter to the force of the spring 25 into the interior of the casing 22 so that the shoulder 27 is disengaged from the abutment 28. Through the compression of the spring 25, a sufficient force is exerted onto the tip of the plunger 23 to guarantee a secure electric connection between the plunger 23 and the contact 17 to be tested of the test sample 29.

In FIG. 3, a spring-loaded contact pin 40" is illustrated which has a metallic casing 30 corresponding to the casings 1 or 22. Surrounded by the casing 30 is a plunger 31 which has a probe member 32 projecting from the lower end of the casing 30 and a guide member 33. In contrast to the previously described embodiments, the guide member 33 extends beyond the casing 30 and thus no lid is required. In this embodiment, the rearward or top end 34 of the guide member 33 serves as terminal for allowing a wire of the not shown analyzer to be connected thereto.

Along a major portion thereof, the metallic plunger 31 i.e. the guide member 33 is provided with anelongated cutout 35 in which a draw or tension spring 36, preferably a helical spring, is located. One end of the spring 36 is fixed in a borehole 37 of the plunger 31 while its other end is attached to a pin 38 which extends transversely to the elongation of the pin 40" through the casing 30 and the cutout 35.

In the neutral position as illustrated in FIG. 3, the spring 36 draws the plunger 31 with its shoulder 39 against the abutment 40 defined by the tapered portion of the casing 30. In the event, however, a casing 30 of continuous cylindrical shape is preferred, the plunger 31 can be provided with a projection 41 which rests on the upper rim of the casing 30 when being in the neutral position (FIG. 5).

The spring 36 exerts a certain prestress when the plunger 31 is in its lowest or neutral position. Upon setting onto a test sample, the plunger 31 will be pushed backwardly i.e. upwardly when referring to FIG. 3 so that the spring 36 will exert a sufficient force onto the plunger 31 to secure a conductivity with the test contact. The amount of the spring force and the characteristic of the spring can be varied in a wide range by using appropriate springs.

The casings are preferably made of copper base alloy, e.g. tin bronze, while steel or copper-beryllium is used for the plungers. The compression springs are made of hardenable noble metal base alloy or copper-beryllium and for the draw spring e.g. steel is used. The terminals 10,24,34 can be e.g. of brass. For those surfaces serving as current conductive junctions, suitable coatings of nickel, silver, gold or rhodium can be provided.

In general the springs, especially when being soldered or welded with their ends to the plungers and to the casings, can secure an electric connection. However, since the plunger and the surrounding casing have sufficient contact areas with each other, such an electric connection is not necessary. In the latter case, when not being an electrically conductive part—especially when being used as draw spring—the spring can be made of non-conducting material like elastomeric material e.g. rubber.

Spring-loaded contact pins 40; 40'; 40" can be provided with very low electric resistance between the respective contact tip 16 and the terminals 10; 24; 34. This is important as the electric testing will then not be affected by the pin resistance.

Manufacturing of the casings is suitably made by deformation, like flattening of a circular pipe with accurate and uniform dimensions of the cross section. An especially small width y can be obtained by simply connecting two parallel side walls with respective roundings. The plunger can be produced by flattening a round wire until the desired flat profile is obtained.

I claim:

1. A spring-loaded contact pin for contacting a test piece for its electrical operativeness, comprising:

an elongated conductive casing of oval cross section, open at opposite ends and formed with a pair of generally planar sides joined by rounded edges such that, in cross section, said casing forms an oval having a longitudinal axis parallel to said sides and along which a major dimension of the oval cross section is at least twice a transverse dimension thereof as measured along a transverse axis perpendicular to said sides, said casing being of uniform cross section over its entire length;

a conductive plunger slidable in said casing and of an oval cross section corresponding to that of said casing, said plunger having a pointed tip at one end projecting from one of said ends of said casing and being formed opposite at a shank of said plunger remote from said tip with a window elongated along a longitudinal axis of said plunger; and a tension spring received in said window and anchored to said casing and said plunger for resiliently urging said tip out of said casing.

2. The contact pin defined in claim 1 wherein said spring is welded to said plunger.

3. The contact pin defined in claim 1 wherein said plunger and said window project out of the other of said ends of said casing.

4. The contact pin defined in claim 1, further comprising an anchor pin spanning the walls of said casing and extending through said window, said spring engaging said anchor pin.

5. The contact pin defined in claim 1, further comprising stop means for retaining said plunger in a neutral position relative to said casing and from which said tip can be pressed into said casing and toward which said plunger is urged by said spring.

6. The contact pin defined in claim 5 wherein said casing has a tapered lower end section to provide said stop means, said plunger abutting against said tapered end section when in said neutral position.

7. The contact pin defined in claim 5 wherein said plunger has a projection adapted to abut said other end of said casing and forming said stop means.

8. The contact pin defined in claim 1 wherein said cross section of said casing has a length of 1 to 10 mm along said longitudinal axis and a width of 0.4 to 3 mm along said traverse axis.

9. The contact pin defined in claim 1 wherein said casing is made from a copper base alloy and said plunger is made of steel or copper-beryllium.

* * * * *